(12) United States Patent
Hecht

(10) Patent No.: US 9,704,573 B1
(45) Date of Patent: Jul. 11, 2017

(54) THREE-TRANSISTOR RESISTIVE RANDOM ACCESS MEMORY CELLS

(71) Applicant: Microsemi SoC Corporation, San Jose, CA (US)

(72) Inventor: Volker Hecht, Barsinghausen (DE)

(73) Assignee: Microsemi SoC Corporation, San Jose, CA (US)

( * ) Notice: Subject to any disclaimer, the term of this patent is extended or adjusted under 35 U.S.C. 154(b) by 0 days.

(21) Appl. No.: 15/375,046

(22) Filed: Dec. 9, 2016

Related U.S. Application Data

(60) Provisional application No. 62/402,927, filed on Sep. 30, 2016.

(51) Int. Cl.
| | |
|---|---|
| *G11C 11/00* | (2006.01) |
| *G11C 13/00* | (2006.01) |
| *H01L 27/24* | (2006.01) |
| *H01L 23/528* | (2006.01) |

(52) U.S. Cl.
CPC ...... *G11C 13/0069* (2013.01); *G11C 13/0097* (2013.01); *H01L 23/528* (2013.01); *H01L 27/2436* (2013.01); *H01L 27/2463* (2013.01); *G11C 2013/0078* (2013.01); *G11C 2213/79* (2013.01)

(58) Field of Classification Search
CPC .................. G11C 13/0004; G11C 13/0069
USPC .................................................. 365/148, 163
See application file for complete search history.

(56) References Cited

U.S. PATENT DOCUMENTS

| | | |
|---|---|---|
| 5,986,322 A | 11/1999 | McCollum et al. |
| 8,735,211 B2 | 5/2014 | Greeley et al. |
| 2006/0171200 A1 | 8/2006 | Rinerson et al. |
| 2011/0001108 A1 | 1/2011 | Greene et al. |
| 2014/0233301 A1 | 8/2014 | Lu et al. |
| 2014/0264238 A1 | 9/2014 | Jo |
| 2014/0269008 A1* | 9/2014 | Baker, Jr. ........... G11C 13/0002 365/148 |

OTHER PUBLICATIONS

PCT/US2016/066955, Notification of Transmittal of The International Search Report and The Written Opinion of the International Searching Authority, or the Declaration, Form PCT/ISA/220.

* cited by examiner

*Primary Examiner* — Huan Hoang
(74) *Attorney, Agent, or Firm* — Leech Tishman Fuscaldo & Lampl; Kenneth D'Alessandro, Esq.

(57) ABSTRACT

A pair of adjacent ReRAM cells in an array includes a first bit line for a row of the array, a second bit line for the row of the array, a p-channel word line associated with two adjacent columns in the array, and an n-channel word line associated with the two adjacent columns. A pair of ReRAM cells in the adjacent columns in the row each includes a switch node, a first ReRAM device connected between the first bit line and the source of a p-channel transistor. The drain of the p-channel transistor is connected to the switch node, and its gate is connected to the p-channel word line. A second ReRAM device is connected between the second bit line and the source of an n-channel transistor. The drain of the n-channel transistor is connected to the switch node, and its gate is connected to the n-channel word line.

7 Claims, 4 Drawing Sheets

|          | VB 16 | GB 22 | BL 32 | BL other rows | WL 30 | WL 34 | WLPP 24 | WLNP 26 |
|---|---|---|---|---|---|---|---|---|
| Operate | 1.5 | 0 | 0.8 | N/A | 0 | 0 | 1.0 | 0.5 |
| Erase 12a 12b | 1.8 | 0 | 0 | 1.8 | 1.8 | 1.8 | -0.8 | 0 |
| Erase 14a 14b | 1.8 | 0 | 1.8 | 0 | 2.5 | 2.5 | 1.8 | 2.5 |
| Pgm 12a 12b | 0 | 1.8 | 1.8 | 0 | 2.5 | 2.5 | 0 | 0 |
| Pgm 12a | 0 | 1.8 | 1.8 | 0 | 2.5 | 0 | 0 | 0 |
| Pgm 12b | 0 | 1.8 | 1.8 | 0 | 0 | 2.5 | 0 | 0 |
| Pgm 14a 14b | 0 | 1.8 | 0 | 1.8 | 1.8 | 1.8 | 1.8 | 1.8 |
| Pgm 14a | 0 | 1.8 | 0 | 1.8 | 1.8 | 0 | 1.8 | 1.8 |
| Pgm 14b | 0 | 1.8 | 0 | 1.8 | 0 | 1.8 | 1.8 | 1.8 |

Low-Voltage Transistors

FIG. 2A

|          | VB 16 | GB 22 | BL 32 | BL other rows | WL 30 | WL 34 | WLPP 24 | WLNP 26 |
|---|---|---|---|---|---|---|---|---|
| Operate | 1.5 | 0 | 0.8 | N/A | 0 | 0 | 1.0 | 0.5 |
| Erase 12a | 1.8 | 0 | 0 | 1.8 | 1.8 | 0 | -0.8 | 0 |
| Erase 14a | 1.8 | 0 | 0 | 1.8 | 0 | 1.8 | -0.8 | 0 |
| Erase 12b | 1.8 | 0 | 1.8 | 0 | 2.5 | 0 | 1.8 | 2.5 |
| Erase 14b | 1.8 | 0 | 1.8 | 0 | 0 | 2.5 | 1.8 | 2.5 |
| Pgm 12a | 0 | 1.8 | 1.8 | 0 | 2.5 | 0 | 0 | 0 |
| Pgm 12b | 0 | 1.8 | 1.8 | 0 | 0 | 2.5 | 0 | 0 |
| Pgm 14a | 0 | 1.8 | 0 | 1.8 | 1.8 | 0 | 1.8 | 1.8 |
| Pgm 14b | 0 | 1.8 | 0 | 1.8 | 0 | 1.8 | 1.8 | 1.8 |

High-Voltage Transistors

FIG. 2B

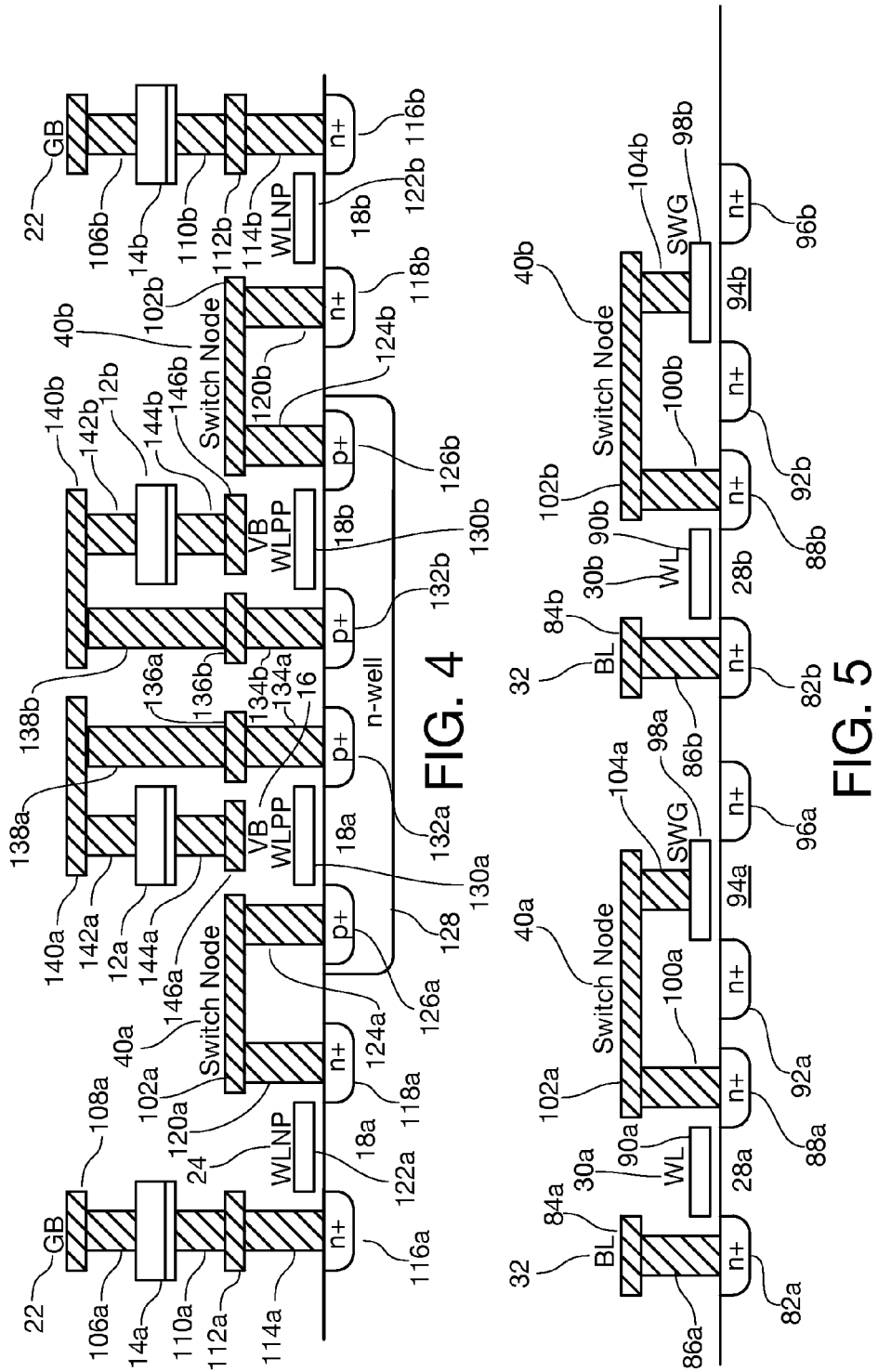

US 9,704,573 B1

THREE-TRANSISTOR RESISTIVE RANDOM ACCESS MEMORY CELLS

CROSS REFERENCE TO RELATED APPLICATIONS

This application claims the benefit of U.S. Provisional Patent Application No. 62/402,927 filed Sep. 30, 2016, the contents of which are incorporated in this disclosure by reference in its entirety.

BACKGROUND

The present invention relates to resistive random access memory ReRAM devices and to push-pull memory cells formed from these devices. More particularly, the present invention relates to three-transistor push-pull ReRAM cells.

The contents of applications Ser. No. 15/374,957 entitled LOW LEAKAGE RESISTIVE RANDOM ACCESS MEMORY CELLS AND PROCESSES FOR FABRICATING SAME; Ser. No. 15/375,014 entitled LOW LEAKAGE ReRAM FPGA CONFIGURATION CELL; and Ser. No. 15/375,036 entitled THREE-TRANSISTOR RESISTIVE RANDOM ACCESS MEMORY CELLS filed on the same date of this application are expressly incorporated herein by reference in their entirety.

SUMMARY

According to one aspect of the present invention, a pair of adjacent ReRAM cells in an array includes a first bit line for a row of the array, a second bit line for the row of the array, a p-channel word line associated with two adjacent columns in the array, and an n-channel word line associated with the two adjacent columns. A pair of ReRAM cells in the adjacent columns in the row each includes a switch node, a first ReRAM device connected between the first bit line and the source of a p-channel transistor. The drain of the p-channel transistor is connected to the switch node, and its gate is connected to the p-channel word line. A second ReRAM device is connected between the second bit line and the source of an n-channel transistor. The drain of the first n-channel transistor is connected to the switch node, and its gate is connected to the n-channel word line.

According to another aspect of the present invention, a non-standard transistor type may be employed and a non-standard erase/programming algorithm to enable the usage of that non-standard transistor type.

BRIEF DESCRIPTION OF THE DRAWINGS

The invention will be explained in more detail in the following with reference to embodiments and to the drawing in which are shown:

FIG. 2A is a table showing the various voltage potentials used to operate, erase, and program the ReRAM cells of FIG. 1 in an embodiment where low-voltage transistors are used.

FIG. 2B is a table showing the various voltage potentials used to operate, erase, and program the ReRAM cells of FIG. 1 in an embodiment where high-voltage transistors are used.

FIG. 4 is a cross sectional diagram of the layout of FIG. 3 taken through dashed line 4-4.

FIG. 5 is a cross sectional diagram of the layout of FIG. 3 taken through dashed line 5-5.

DETAILED DESCRIPTION

Persons of ordinary skill in the art will realize that the following description of the present invention is illustrative only and not in any way limiting. Other embodiments of the invention will readily suggest themselves to such skilled persons.

Figure 1:
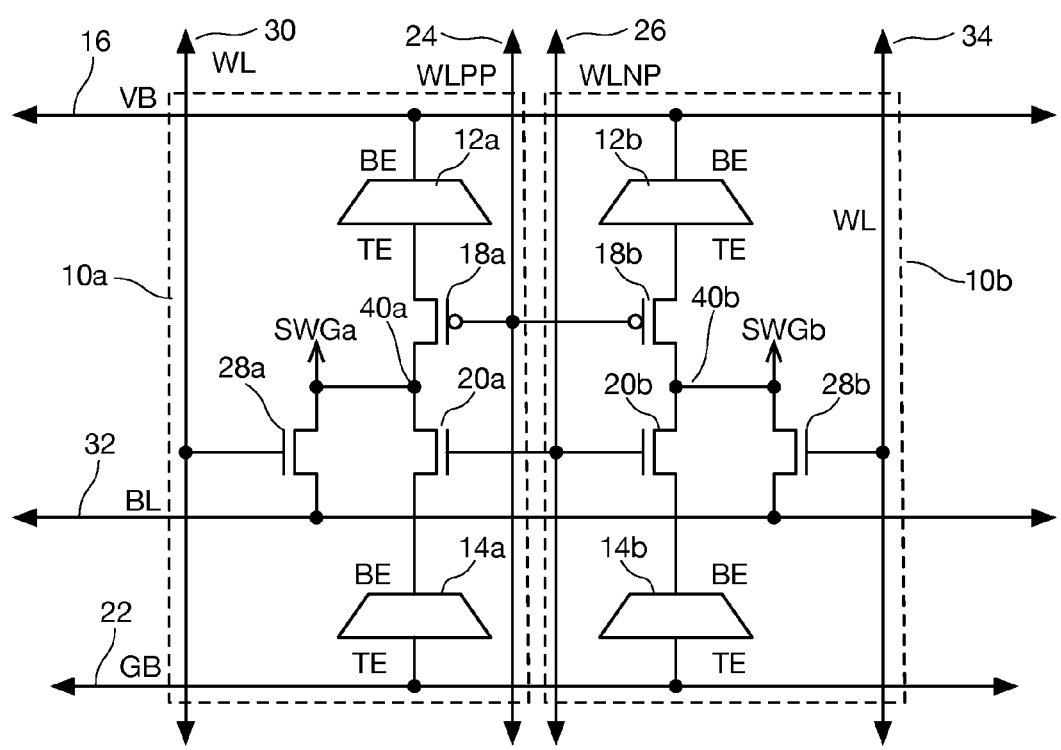
FIG. 1 is a schematic drawing of a pair of three-transistor ReRAM cells according to one aspect of the present invention.

Referring first of all to FIG. 1, schematic drawing shows a pair of three-transistor ReRAM cells according to one aspect of the present invention. Memory cell 10a and memory cell 10b are located in the same row of a ReRAM memory array. Memory cell 10a includes a pair of ReRAM devices 12a and 14a connected in push-pull configuration, the ReRAM device 12a being a pullup device and the ReRAM device 14a being a pulldown device.

In the drawing figures presented herein, the ReRAM devices are shown bearing the designations TE and BE at opposing ends thereof. The ReRAM devices disclosed herein are fabricated between two metal interconnect layers in an integrated circuit and the designation TE refers to the upper (top) one of these metal interconnect layers and the designation BE refers to the lower (bottom) one of these metal interconnect layers. The orientation of the two ReRAM devices is sometimes referred to as "top" and "bottom".

The BE end of ReRAM device 12a is coupled to a potential voltage VB at VB line 16 and the TE end of ReRAM device 12a is connected through p-channel transistor 18a in series with n-channel transistor 20a to the BE end of ReRAM device 14a. The TE end of ReRAM device 14a is coupled to a potential voltage GB at GB line 22. During normal operation of the ReRAM memory cells 10a and 10b when the ReRAM memory cells 10a and 10b are read, voltage potential at VB line 16 is more positive than voltage potential at GB line 22. Each of voltage potentials VB and GB are switchable between at least two values, as will be explained further below. VB line 16 and GB line 22 are in some embodiments shared among all the rows of memory array. In other embodiments, VB line 16 and GB line 22 are switchable over ranges of cells, with a predetermined granularity. VB line 16 and GB line 22 are also called complementary bit lines. The gate of p-channel transistor 18a is connected to P Word line (WLPP) 24. The gate of re-channel transistor 20a is connected to N Word line (WLNP) 26. There is one P Word line (WLPP) and one N Word line (WLNP) for each pair of adjacent columns of the memory array.

The common drain connection of p-channel transistor 18a and n-channel transistor 20a is connected to the drain of a programming n-channel transistor 28a. The gate of programming transistor 28a is connected to a word line (WL) 30 for a first column of the array and the source of n-channel programming transistor 28a is connected to a bitline (BL) 32 for a row of cells. Bitline 32 is also called a source bitline. There is one word line for each column of the memory array, one source bitline 32 for each row in the array, and one P word line (WLPP) and one N word line (WLNP) for each pair of columns of the array. There can be one VB and one GB global net for the entire array, or these lines can be segmented in the array.

Similarly, memory cell 10b includes a pair of ReRAM devices 12b and 14b connected in push-pull configuration, the ReRAM device 12b being a pullup device and the ReRAM device 14b being a pulldown device.

The BE end of ReRAM device 12b is coupled to the potential voltage VB at VB line 16 and the TE end of ReRAM device 12b is connected through p-channel transistor 18b in series with n-channel transistor 20b to the BE end of ReRAM device 14b. The TE end of ReRAM device 14b is coupled to the potential voltage GB at GB line 22. The gate of p-channel transistor 18b is connected to the P Word line (WLPP) 24. The gate of n-channel transistor 20b is connected to the N Word line (WLNP) 26.

The common drain connection of p-channel transistor 18b and n-channel transistor 20b is connected to the drain of a programming n-channel transistor 28b. The gate of programming transistor 28b is connected to a word line (WL) 34 for a second column of the array and the source of n-channel programming transistor 28b is connected to the source bitline (BL) 32 for a row of cells. As indicated above, source bitline BL 32 is interchangeably called a source bitline.

FIG. 1 shows one row of a ReRAM array in accordance with this aspect of the present invention. Persons of ordinary skill in the art will appreciate that other rows in the array will be configured as shown in FIG. 1 but that each additional row will have its own unique bit line BL. In addition, such skilled persons will appreciate that additional columns of the ReRAM array will also be configured as shown in FIG. 1, but each additional column will have its own unique word line WL like WL 30 or word line 34 and each additional pair of adjacent columns will have their own WLNP and WLPP lines like WLNP and WLPP lines 24 and 26. By employing the architecture of FIG. 1 in which the WLPP and WLNP lines 24 and 26 are shared between memory cells in an adjacent pair of columns of each row, only two lines running in the column direction instead of four lines are required.

During normal circuit operation one of the ReRAM devices in each ReRAM cell is in its ON state and the other ReRAM device is in its OFF state. P-channel transistors 18a and 18b and n-channel transistors 20a and 20b in their respective ReRAM cells 10a and 10b are turned on, and the output node of each ReRAM cell (the common drain connection of p-channel transistor 18a in n-channel transistor 20a indicated at reference numeral 40a in ReRAM cell 10a and the common drain connection of p-channel transistor 18b and n-channel transistor 20b indicated at reference numeral 40b in ReRAM cell 10b) is either pulled up to the voltage at VB line 16 or pulled down to the voltage line GB 20 depending on which one of the ReRAM devices 12a or 14a in ReRAM cell 10a (or 12b or 14b in ReRAM cell 10b) are turned on. Only one of the ReRAM devices of each cell can be turned on during normal operation; the other ReRAM device must be turned off. The output nodes 40a and 40b may each be connected to a switch line SWGa and SWGb respectively to drive the gate of one or multiple switch transistors (not shown) or to one or multiple inputs of any functional circuit block, where the ReRAM array is used to configure functions or interconnections in a programmable integrated circuit device. Persons of ordinary skill in the art will recognize that the ReRAM cells of the present invention can also be used for other purposes.

Referring now to FIGS. 2A and 2B, two tables show the various voltage potentials used to operate, erase, and program the ReRAM cells of FIG. 1 for two alternative embodiments, distinguished by the transistor types used.

If all transistors are conventional high-voltage transistors fabricated for power-supply voltages of 1.8V, having BVJ and BVDSS limits of 1.8V and BVG or 2.5V, FIG. 2B applies. In this case all columns must be first erased sequentially, before all columns can be programmed sequentially. The order in which ReRAM devices 12a, 12b, 14a or 14b are erased or programmed does not matter. Erasing or programming can also be performed sequentially on subsets of bits, using inhibit voltages on the other bit lines to prevent the operation and lower total current.

According to one aspect of the present invention, custom n-channel and p-channel devices, which combine low-voltage (1.05V) implants with high-voltage (2.5V) oxide, can be employed. Employing such devices allows the usage of low-voltage design rules. Such devices have BVDSS limits of 1.05V, BVG of 2.5V, while a BVJ of 1.8V is usually feasible even with low/voltage implants. Such devices are much smaller than conventional high-voltage transistors. To enable the use of such custom devices, the voltages employed in the erase/programming algorithm must meet the BVDSS specification of each such device. Persons of ordinary skill in the art will observe that the terms "low-voltage" and "high-voltage" are relative terms, but that in any integrated circuit, the difference between the two types of transistors is well understood and involves gate oxide thicknesses and implants tailored for "low-voltage" and "high-voltage" operation in any given integrated circuit. The particular voltage values given herein are for devices fabricated using processes practiced at the time the present application was filed.

According to an aspect of the invention illustrated in FIGS. 2A and 2B, different programming algorithms are employed depending on whether conventional high-voltage transistors are employed or such custom transistors are employed in the memory cells. As depicted in FIG. 2A, if custom transistors are used, the programming algorithm combines erase operations on column-pairs, followed by programming operations on column-pairs, followed by program operations on individual columns, more precisely starting with an erase step of column pairs including ReRAM devices 12a and 12b in the entire word, followed by an erase step of column pairs including ReRAM devices 14a and 14b in the entire word, followed by a program step of column-pairs including ReRAM devices 12a and 12b in selected rows where both ReRAM devices 12a and 12b need to be programmed, followed by a program step of individual columns in selected rows where only ReRAM devices 12a but not ReRAM devices 12b need to be programmed, followed by a program step of individual columns in selected rows where only ReRAM devices 12b but not ReRAM devices 12a needs to be programmed, followed by a program step of column-pairs including ReRAM devices 14a and 14b in selected rows where both ReRAM devices 14a and 14b need to be programmed, followed by a program step of individual columns in selected rows where only ReRAM devices 14a but not ReRAM devices 14b need to be programmed, followed by a program step of individual columns in selected rows where only ReRAM devices 14b but not ReRAM devices 14a needs to be programmed. All of these erase and programming steps need to be executed on the whole word, while inhibiting the operation in a subset of rows is not possible in embodiments where custom transistors are employed.

As shown in FIG. 2B, in embodiments where conventional transistors are used, the program and erase operation can be performed on individual ReRAM devices.

The first row of the table of FIGS. 2A and 2B show the voltage potentials applied to the various control lines of the array during the normal operating mode of the array when the contents of the ReRAM cells 10a and 10b are used to drive switch gates or functional block inputs. The WLPP and WLNP voltages can be chosen to be 1V and 0.5V, respectively, for low leakage or both the WLPP and WLNP voltages can be 0.8V for design simplification. The remaining rows of both tables show the potentials to apply to the various control lines to program or erase the ReRAM devices 12a and 14a in cell 10a and ReRAM devices 12b and 14b in cell 10b, whereby the different erase/programming algorithms mentioned above supporting different device usages use different steps in different orders as listed in FIG. 2A and FIG. 2B. Persons of ordinary skill in the art will appreciate that the column of the tables relating to biasing of source bitlines for unselected rows is not applicable during normal operation of the memory array when it is used as a configuration memory for a user programmable integrated circuit. If the memory array is used for purposes other than as a configuration memory, unused rows may be inhibited by placing 0.8V on the source bitlines for those rows.

Word-lines WL 30 or WL 34 in inhibited columns are biased to 0V, N-channel-word-lines WLNP 26 in inhibited pairs of adjacent columns are biased to 0V and P-channel-word-lines WLPP 24 in inhibited pairs of adjacent columns are biased to 1.8V.

Figure 3:
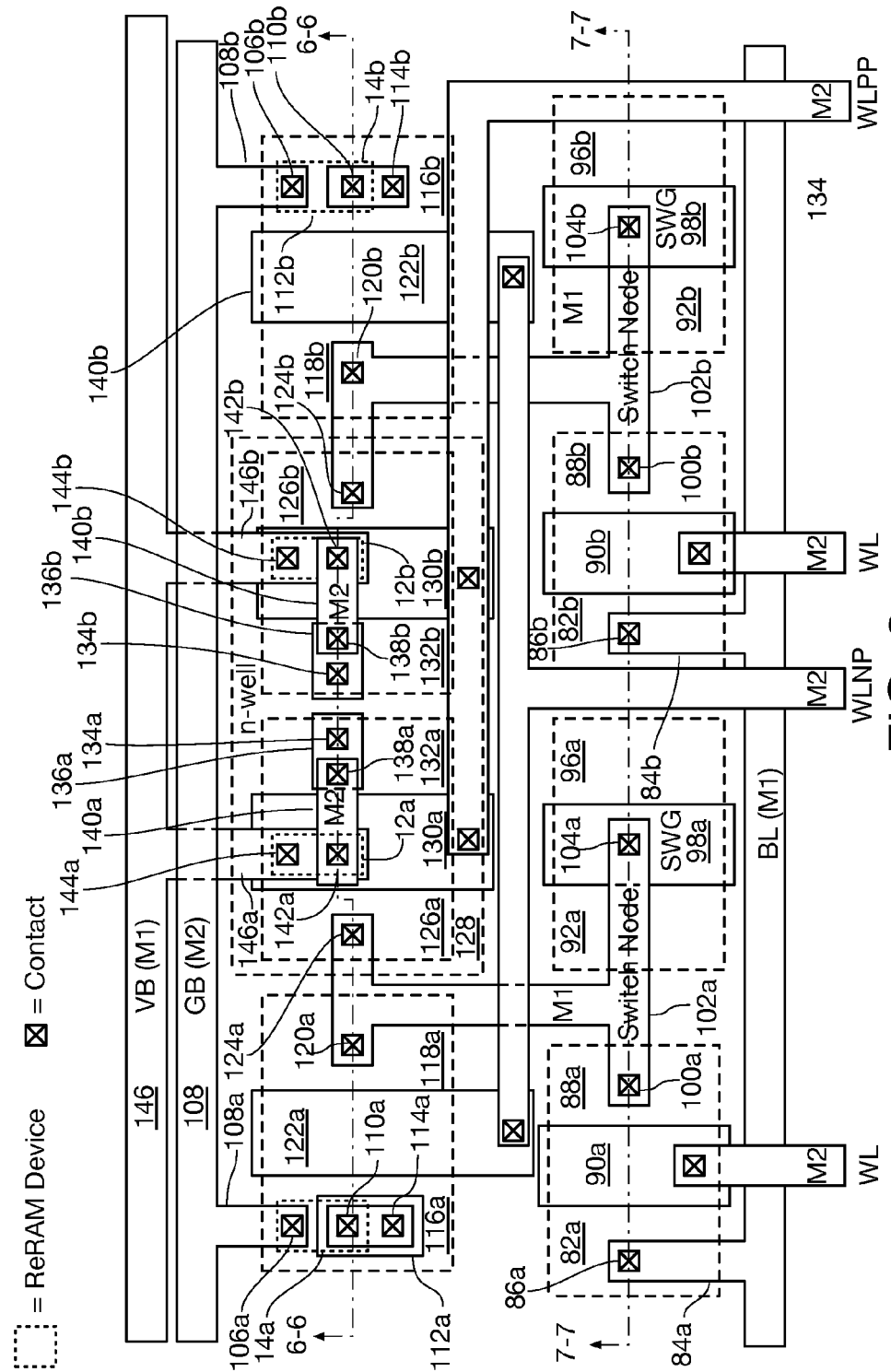
FIG. 3 is a top view of an exemplary layout drawing for a three-transistor ReRAM cell according to another aspect of the present invention.

FIG. 3 is a top view of an exemplary layout for the pair of ReRAM cells 10a and 10b depicted in FIG. 1. FIG. 4 is a cross sectional view of the pair of ReRAM cells along the line 6-6 in FIG. 3. FIG. 5 is a cross sectional view of the pair of ReRAM cells along the line 7-7 in FIG. 3. Where appropriate, the same reference numerals used in FIG. 1 will be used to designate like structures in FIGS. 3, 4, and 5. Structures associated only with ReRAM cell 10a are indicated with reference numerals having an "a" suffix, and structures associated only with ReRAM cell 10b are indicated with reference numerals having an "b" suffix. In order to avoid unnecessarily overcrowding FIGS. 3, 4, and 5, not all reference numerals are indicated in all of the drawings.

In the embodiment shown in FIGS. 3, 4, and 5, diffusion 82a serves as the source of programming transistor 28a and is coupled to the source bitline BL 32 at segment 84a of a first metal interconnect layer through contact 86a. Diffusion 88a serves as the drain of the programming transistor 28a. Polysilicon line 90a serves as the gate of the programming transistor 28a and as a word line WL 30. Diffusion 92a serves as the source of a switch transistor 94a coupled to the cell (not shown in FIG. 1). Diffusion 96a serves as the drain of the switch transistor 94a. Polysilicon line 98a serves as the gate of the switch transistor 94a.

Contact 100a connects the drain of the programming transistor 94a to switch node 40a at a segment 102a of the first metal interconnect layer. Contact 104a connects the gate 98a of the switch transistor 94a to switch node 40a at the segment 102a of the first metal interconnect layer. Contact 106a connects GB line 22 at segment 108a of the second metal interconnect layer to the top of ReRAM device 14a (shown as a dashed-line square in FIG. 3). Contact 110a connects the bottom of ReRAM device 14a to segment 112a of the first metal interconnect layer. Contact 114a connects segment 112a of the first metal interconnect layer to the source diffusion 116a of the n-channel transistor 20a. The drain 118a of the n-channel transistor 20a is connected by contact 120a to the switch node 40a at the segment 102a of the first metal interconnect layer. The gate of n-channel transistor 20a is formed from polysilicon line 122a.

Contact 124a connects the switch node 40a at the segment 102a of the first metal interconnect layer to the drain 126a of the p-channel transistor 18a located in n-well 128 (shown in dashed lines in FIG. 3). The gate of the p-channel transistor 18a is formed from polysilicon line 130a. The source 132a of p-channel transistor 18a in n-well 128 is coupled by contact 134a to a segment 136a of the first metal interconnect layer and segment 136a of the first metal layer is connected by contact 138a to segment 140a of the second metal interconnect layer. Segment 140a of the second metal interconnect layer is connected to the top of ReRAM device 12a through contact 142a. The bottom of ReRAM device 12a is connected through contact 144a to the VB line 16 at segment 146a of the first metal interconnect layer.

Similarly, diffusion 82b serves as the source of programming transistor 28b and is coupled to the bitline BL 32 at segment 84b of a first metal interconnect layer through contact 86b. Diffusion 88b serves as the drain of the programming transistor 28b. Polysilicon line 90b serves as the gate of the programming transistor and as a word line WL 30. Diffusion 92b serves as the source of a switch transistor 94b coupled to the cell (not shown in FIG. 1). Diffusion 96b serves as the drain of the switch transistor 94b. Polysilicon line 98b serves as the gate of the switch transistor 94b.

Contact 100b connects the drain of the programming transistor 94b to a segment 102b of the first metal interconnect layer. Contact 104b connects the gate 98b of the switch transistor 94b to the segment 102b of the first metal interconnect layer. Contact 106b connects segment 108b of the second metal interconnect layer to the top of RRAM device 14b (shown as a dashed-line square in FIG. 5). Contact 110b connects the bottom of RRAM device 14b to segment 112b of the first metal interconnect layer. Contact 114b connects segment 112b of the first metal interconnect layer to the source diffusion 116b of the n-channel transistor 20b. The drain 118b of the n-channel transistor 20b is connected by contact 120b to the switch node 40b at the segment 102b of the first metal interconnect layer. The gate of n-channel transistor 20b is formed from polysilicon line 122b.

Contact 124b connects the switch node 40b at the segment 102b of the first metal interconnect layer to the drain 126b of the p-channel transistor 18b located in n-well 128 (shown in dashed lines in FIG. 3). The gate of the p-channel transistor 18b is formed from polysilicon line 130b. The source 132b of p-channel transistor 18b in n-well 128 is coupled by contact 134b to a segment 136b of the first metal interconnect layer and segment 136b of the first metal layer is connected by contact 138b to segment 140b of the second metal interconnect layer. Segment 140b of the second metal interconnect layer is connected to the top of ReRAM device 12b through contact 142b. The bottom of ReRAM device 12b is connected through contact 144b to the VB line 16 at segment 146b of the first metal interconnect layer.

Persons of ordinary skill in the art will appreciate that FIGS. 3, 4, and 5 show a "front-to-back" arrangement of RRAM devices 12a, 14a, 12b and 14b. The embodiment shown in FIGS. 3, 4, and 5 takes slightly more area, but, because the RRAM devices 12a, and 14a, and 12b and 14b are arranged into a cell in a "front-to-back" configuration, avoids disturbing whichever device is off during normal operation.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In an array of low-leakage ReRAM cells, a circuit arrangement comprising:
    first and second complementary bit lines associated with the array;
    a source bit line associated with a row of the array;
    a p-channel word line associated with a pair of adjacent columns in the array;
    an n-channel word line associated with the pair of adjacent columns in the array;
    a first ReRAM cell in the row at a first one of the pair of adjacent columns, the first ReRAM cell including:
        a first switch node;
        a first ReRAM device having a first end connected to the first complementary bit line;
        a first p-channel transistor having a source connected to a second end of the first ReRAM device, a drain connected to the first switch node, and a gate connected to the p-channel word line;
        a second ReRAM device having a first end connected to the second complementary bit line; and
        a first n-channel transistor having a source connected to a second end of the second ReRAM device, a drain connected to the first switch node, and a gate connected to the n-channel word line;
    a second ReRAM cell in the row at a second one of the pair of adjacent columns, the second ReRAM cell including:
        a second switch node;
        a third ReRAM device having a first end connected to the first complementary bit line;
        a second p-channel transistor having a source connected to a second end of the third ReRAM device, a drain connected to the second switch node, and a gate connected to the p-channel word line;
        a fourth ReRAM device having a first end connected to the second complementary bit line; and
        a second n-channel transistor having a source connected to a second end of the fourth ReRAM device, a drain connected to the second switch node, and a gate connected to the n-channel word line.

2. The circuit arrangement of claim 1, further comprising:
    a source bit line associated with the row;
    a first word line associated with the first one of the pair of adjacent columns;
    a second word line associated with the second one of the pair of adjacent columns;
    wherein the first ReRAM cell further includes a first programming transistor having a source connected to the source bit line, a drain connected to the first switch node, and a gate connected to the first word line; and
    wherein the second ReRAM cell further includes a second programming transistor having a source connected to the source bit line, a drain connected to the second switch node, and a gate connected to the second word line.

3. The circuit arrangement of claim 1, further comprising:
    a first switch transistor having a gate connected to the first switch node; and
    a second switch transistor having a gate connected to the second switch node.

4. The circuit arrangement of claim 1 wherein the first and second n-channel and p-channel transistors are formed using low-voltage implants with high-voltage gate oxide layers.

5. The circuit arrangement of claim 2 wherein the first and second n-channel and p-channel transistors and the programming transistors are formed using low-voltage implants with high-voltage gate oxide layers.

6. In an array of low-leakage ReRAM cells, a pair of adjacent ReRAM cells in a row of the array, comprising:
    first and second complementary bit lines associated with the row of the array;
    a p-channel word line associated with a pair of adjacent columns in the array;
    an n-channel word line associated with the pair of adjacent columns in the array;
    a pair of ReRAM cells in the adjacent columns of the array in the row, each ReRAM cell including:
        a switch node;
        a first ReRAM device having a first end connected to the first complementary bit line;
        a p-channel transistor having a source connected to a second end of the first ReRAM device, a drain connected to the switch node, and a gate connected to the p-channel word line;
        a second ReRAM device having a first end connected to the second complementary bit line; and
        an n-channel transistor having a source connected to a second end of the second ReRAM device, a drain connected to the switch node, and a gate connected to the n-channel word line.

7. A method for programming an array of push-pull ReRAM cells, each cell having an upper ReRAM device and a lower ReRAM device, the method comprising:
    erasing upper ReRAM devices in column-pairs followed by erasing lower ReRAM devices in the column pairs;
    programming ReRAM devices in column-pairs in selected rows where both upper ReRAM devices are to be programmed;
    programming upper ReRAM devices in individual columns of selected rows where only upper ReRAM devices are to be programmed;
    programming lower ReRAM devices in column-pairs of selected rows where both lower ReRAM are to be programmed;
    programming lower ReRAM devices in individual columns in selected rows where only lower ReRAM devices are to be programmed.

* * * * *